(12) United States Patent
Jun et al.

(10) Patent No.: US 7,851,063 B2
(45) Date of Patent: Dec. 14, 2010

(54) POLYMER PARTICLES AND CONDUCTIVE PARTICLES HAVING ENHANCED CONDUCTING PROPERTIES, AND ANISOTROPIC CONDUCTIVE PACKAGING MATERIALS CONTAINING THE SAME

(75) Inventors: Jung Bae Jun, Gunpo-si (KR); Jin Gyu Park, Seoul (KR); Jae Ho Lee, Yongin-si (KR); Tae Sub Bae, Suwon-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 11/828,559

(22) Filed: Jul. 26, 2007

(65) Prior Publication Data
US 2007/0295943 A1    Dec. 27, 2007

Related U.S. Application Data

(63) Continuation-in-part of application No. PCT/KR2005/001558, filed on May 27, 2005.

(30) Foreign Application Priority Data

Feb. 22, 2005   (KR) .............. 10-2005-0014389

(51) Int. Cl.
*B32B 5/16* (2006.01)
(52) U.S. Cl. ............ 428/407; 428/402; 428/403; 252/512; 427/222
(58) Field of Classification Search .......... 252/512; 428/403, 402, 407; 427/222
See application file for complete search history.

(56) References Cited

U.S. PATENT DOCUMENTS

| | | | |
|---|---|---|---|
| 4,790,551 A | 12/1988 | Ukai et al. | |
| 5,486,941 A | 1/1996 | Saiuchi et al. | |
| 6,344,156 B1 * | 2/2002 | Yamada et al. | 252/512 |
| 7,291,393 B2 * | 11/2007 | Wakiya et al. | 428/403 |
| 7,338,710 B2 * | 3/2008 | Kamiya et al. | 428/403 |
| 2001/0046021 A1 * | 11/2001 | Kozuka et al. | 349/150 |
| 2006/0263581 A1 | 11/2006 | Park et al. | |

FOREIGN PATENT DOCUMENTS

| | | |
|---|---|---|
| EP | 1426979 A1 * | 6/2004 |
| JP | 62-177082 | 8/1987 |
| JP | 07-118617 | 5/1995 |
| JP | 11-125953 | 5/1995 |
| JP | 07-256231 | 10/1995 |
| JP | 08-325543 | 12/1996 |
| JP | 2003-26813 | 1/2003 |
| JP | 2003-253231 | 9/2003 |
| JP | 2003-257247 | 9/2003 |
| JP | 2003-313304 | 11/2003 |
| KR | 10-2005-0043639 | 5/2005 |
| WO | 92/06402 | 4/1992 |

OTHER PUBLICATIONS

International Search Report and Written Opinion in corresponding International Application No. PCT/KR2005/001558, mailed on Oct. 25, 2005.

* cited by examiner

*Primary Examiner*—Harold Y Pyon
*Assistant Examiner*—Haidung D Nguyen
(74) *Attorney, Agent, or Firm*—Summa, Additon & Ashe, P.A.

(57) ABSTRACT

Disclosed herein are anisotropic conductive particles contained in anisotropic conductive adhesive films, which can be used in circuit board mounting applications. The conductive particles can exhibit superior electrical reliability. Further disclosed are polymer particles having good compressive deformability and recoverability from deformation without being ruptured when an adhesive film containing conductive particles including the polymer particles as a component is interposed and compressed between connection substrates, thereby achieving a sufficient contact area between the particles and the connection substrates. Because the polymer particles have a spherical shape, a uniform particle diameter, and a narrow particle diameter distribution, the particles can exhibit enhanced conducting properties.

18 Claims, 1 Drawing Sheet

POLYMER PARTICLES AND CONDUCTIVE PARTICLES HAVING ENHANCED CONDUCTING PROPERTIES, AND ANISOTROPIC CONDUCTIVE PACKAGING MATERIALS CONTAINING THE SAME

CROSS REFERENCE TO RELATED APPLICATIONS

This non-provisional application is a continuation-in-part application of PCT Application No. PCT/KR2005/001558, filed May 27, 2005, pending, which designates the U.S. and which is hereby incorporated by reference in its entirety, and from Korean Patent Application No. 10-2005-0014389, filed Feb. 22, 2005, which is also hereby incorporated by reference in its entirety.

FIELD OF THE INVENTION

The present invention relates to anisotropic conductive packaging materials, e.g., conductive adhesives, anisotropic conductive adhesive films and conductive connection structures, for mounting circuit boards. The present invention also relates to conductive particles used to produce the packaging materials and polymer particles used as base particles of the conductive particles.

BACKGROUND OF THE INVENTION

Anisotropic conductive connection can be required to electrically connect connection electrodes of an IC circuit board to terminals of a substrate mounted on a circuit board, such as a liquid crystal display (LCD) panel. Film-type adhesives are widely used as anisotropic conductive packaging materials, in which conductive particles, such as metal-coated resin particles or metal particles, are dispersed in an insulating resin, e.g., epoxy, urethane, or acrylic resin.

Conductive particles are interposed between electrodes and terminals by disposing an anisotropic conductive packaging material containing the conductive particles between the electrodes and the terminals and applying pressure and heat to adhere the packaging material therebetween. Currently, electrical connection occurs in a pressing direction, and an insulation state is maintained in a direction perpendicular to the pressing direction due to the presence of insulating components contained in an insulating adhesive.

In circuit board packaging requiring anisotropic conductive connection, recent advances in circuit technologies have increased connection pitch compactness, IC bump minuteness and the number of leads printed on substrates. Further, there continues to be a need for improved electrical connection reliability.

To satisfy such technical needs, conductive particles contained in anisotropic conductive films are largely required to have a uniform and small particle diameter. Further, it can be critical that conductive particles have enhanced conducting properties without being ruptured, together with good compressive deformability and recoverability from deformation, because of increased contact area with connection substrates when the conductive particles are interposed and compressed between the connection substrates.

Metal particles, such as nickel, gold and silver particles, and metal-coated base particles can be used as the conductive particles. However, since metal particles have a non-uniform shape and a much higher specific gravity than an adhesive resin, they can have poor dispersibility in the adhesive resin. For these reasons, in mounting applications requiring superior connection of microelectrodes and high connection reliability, conductive particles with a uniform shape and a relatively narrow particle diameter distribution are widely used as a plated layer formed on base polymer particles.

Various proposals have hitherto been made on conductive particles in which polymer particles are plated, and particularly on the characteristics of the particles after compressive deformation in terms of improved contact with electrodes and connection reliability.

For example, PCT Publication WO 92/06402 discloses a spacer for an LCD and conductive particles using monodisperse resin particles as base particles. According to this publication, in order to readily control a gap between electrodes facing each other when the electrodes are connected to each other by compression using the conductive particles, the resin particles preferably have a compression hardness at 10% compressive deformation (10% K value) of 250 to 700 kgf/mm$^2$. In addition, in order to increase the contact area between the conductive particles and the electrodes after compression, the resin particles preferably have a recovery factor after compressive deformation of 30 to 80%.

Further, Japanese Patent Laid-open No. H07-256231 discloses conductive particles having a K value at 10% compressive deformation of 700 to 1,000 kgf/mm$^2$ and a recovery factor after compressive deformation of 65% to 95% at 20° C. in order to improve poor conductivity caused by changes in the temperature between electrodes, folding, mechanical impact, etc.

Moreover, Japanese Patent Laid-open No. H11-125953 and No. 2003-313304 disclose conductive particles having a K value at 10% compressive deformation of 250 kgf/mm$^2$ or lower and a recovery factor after compressive deformation of 30% or greater for better connection reliability.

These patent publications note that as the recovery factor after compressive deformation of the conductive particles increases, the conducting properties of the conductive particles, e.g., increased contact area with the electrodes, are enhanced. In addition, according to the patent publications, the K value reflecting the compressive deformability of the particles is mostly limited to 10% compressive deformation.

The 10% K value of the particles may be a criterion for the initial compressive deformability of the particles. However, when the conductive particles are interposed and compressed between the electrodes, they show a difference of several % to several tens of % in compressive deformation even under the same pressure, depending on the constitution of the base polymer particles, thus leading to different electrical connection and connection reliability due to the difference in the contact area with the electrodes and contact reliability. In other words, although the 10% K values of the particles are within the defined specific ranges, the deformability of the particles may be different under continuous compression. As a consequence, particles having appropriate 10% K value do not necessarily guarantee the provision of conductive particles with increased contact area and superior connection reliability.

Indeed, conductive particles satisfying the 10% K value in a specific range and showing good compressive deformability upon connection to electrodes commonly have a low recovery factor from deformation. Further, such conductive particles are in sufficient contact with electrodes during compression, but show a low recovery factor from deformation after decompression, resulting in poor connection reliability. Moreover, because conductive particles having good compression recoverability are not sufficiently deformed up to several tens of % under common pressures for connection of electrodes, the connection resistance can increase and the connection reliability is likely degraded. To determine whether the connection resistance decreases and connection reliability improves by sufficiently deforming conductive particles by compression, it is necessary to consider K values at several tens of % compressive deformation together with the initial deformability (i.e. 10% K value) and compression recoverability.

Recently, anisotropic conductive adhesive films in which conductive particles are directly dispersed have been fast-cured under selected conditions, e.g., low temperatures and low pressures, within a short period of time in order to connect electrodes to each other. In this case, as the compressive deformability of the conductive particles is decreased, it can be difficult to sufficiently increase the contact area with the electrode surface. As a result, the connection resistance increases and the connection reliability is likely degraded.

SUMMARY OF THE INVENTION

The present invention can provide polymer particles and conductive particles having good compressive deformability and recoverability from deformation. In particular the present invention can provide polymer particles and conductive particles having enhanced conducting properties without being ruptured when interposed and compressed between connection substrates, thereby achieving a sufficient contact area between the particles and the connection substrates.

The present invention can also provide polymer particles and conductive particles having a substantially uniform shape, a narrow particle diameter distribution, and good compressive deformability and recoverability from deformation.

The present invention can further provide methods for preparing the particles.

The present invention can further provide conductive particles having superior electrical connection reliability and anisotropic conductive packaging materials containing the particles.

Polymer particles in accordance with the present invention can have a 10% K value (i.e., a K value at 10% particle diameter deformation) of about 250 to about 700 kgf/mm$^2$ and a compression recovery factor of about 30 to about 70%, wherein the 30% K value (K value at 30% compressive deformation) and 40% K value (K value at 40% compressive deformation) are maintained at about 20 to about 70% of the 10% K value.

The 10% K value of the polymer particles can be in the range of about 350 to about 600 kgf/mm$^2$.

The compression rupture deformation of the polymer particles can be about 40% or higher.

The present invention can also provide polymer particles with an average particle diameter of about 0.1 to about 200 μm, an aspect ratio lower than about 1.5, and a CV value not higher than about 20%.

The polymer particles of the present invention can be made of a polymer resin including at least one crosslinking polymerizable monomer, a styrene-based monomer, and divinylbenzene. The crosslinking polymerizable monomer can be selected from the group consisting of allyl compounds, e.g., 1,4-butanediol di(meth)acrylate, 1,6-hexanediol di(meth)acrylate, 1,9-nonanediol di(meth)acrylate, allyl (meth)acrylate, divinylsulfone, diallyl phthalate, diallylacrylamide, triallyl (iso)cyanurate and triallyl trimellitate, (poly)alkylene glycol di(meth)acrylate, e.g., (poly)ethylene glycol di(meth) acrylate and (poly)propylene glycol di(meth)acrylate, (poly) dimethylsiloxane di(meth)acrylate, (poly)dimethylsiloxane divinyl, (poly)urethane di(meth)acrylate, pentaerythritol tri (meth)acrylate, pentaerythritol di(meth)acrylate, trimethylolpropane tri(meth)acrylate, di(trimethylolpropane) tetra (meth)acrylate, tetramethylolpropane tetra(meth)acrylate, dipentaerythritol hexa(meth)acrylate, dipentaerythritol penta (meth)acrylate, and glycerol tri(meth)acrylate, the like, and mixtures thereof.

The present invention can also provide conductive particles including the polymer particles and at least one conductive metal layer formed on a surface of the polymer particles.

The conductive metal layer can include at least one metal selected from the group consisting of nickel (Ni), gold (Au), silver (Ag), copper (Cu), platinum (Pt), palladium (Pd), cobalt (Co), tin (Sn), indium (In), and indium tin oxide (ITO). The conductive metal layer can have a thickness of about 0.01 to about 5 μm.

The conductive metal layer can include a double layer of nickel/gold.

The present invention can also provide an anisotropic conductive packaging material containing the conductive particles.

The present invention can also provide an electrical connection structure manufactured by interposing the anisotropic conductive packaging material between a pair of facing substrates, followed by pressing under heating.

The conductive particles of the present invention can include the polymer particles, as base particles of the conductive particles, having a 10% K value (a K value at 10% particle diameter deformation) of about 250 to about 700 kgf/mm$^2$ and a compression recovery factor of about 30 to about 70%, wherein the 30% K value and 40% K value are maintained at about 20 to about 70% of the 10% K value. Accordingly, the conductive particles of the present invention can have good compressive deformability and recoverability. In addition, when the conductive particles are interposed between respective electrodes of a circuit board and the like, the particles can reliably increase contact area while maintaining a constant gap size. Thus the conductive particles can provide superior electrical connection and connection reliability.

BRIEF DESCRIPTION OF THE DRAWINGS

The above and other objects, features and other advantages of the present invention will be more clearly understood from the following detailed description taken in conjunction with the accompanying drawing, in which.

DETAILED DESCRIPTION OF THE INVENTION

Figure 1:
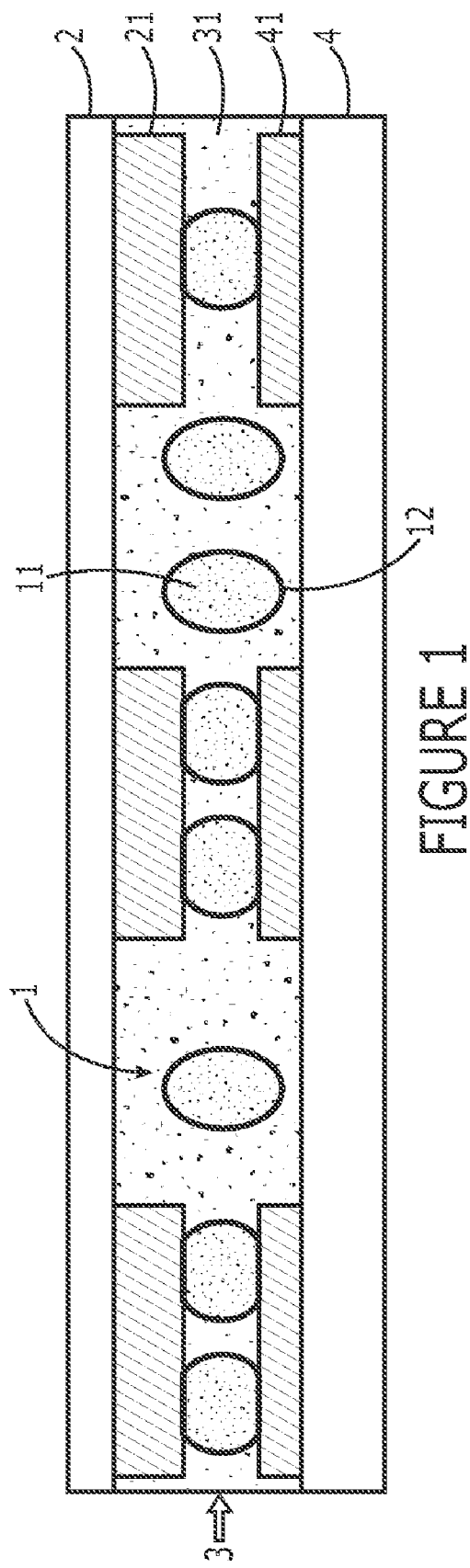
FIG. 1 is a cross-sectional view of an electrical connection structure of an anisotropic conductive film using conductive particles of the present invention.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The polymer particles of the present invention can be used in the preparation of conductive particles, which in turn can be used in electrical connection structures of microelectrodes, anisotropic conductive adhesive films, and the like, in circuit board mounting applications. Specifically, the polymer particles of the present invention are surface-coated with at least one metal layer to prepare conductive particles.

To exhibit enhanced conducting properties when the polymer particles of the present invention are used in the above-mentioned electrical packaging materials, the polymer particles will have optimum compressive deformability and compression recoverability. In use, when electrodes are electrically connected to each other through the conductive particles, in which a conductive metal layer is formed on the polymer particles of the present invention, the polymer particles are readily deformed under pressure and hence the contact area with the electrodes is increased, thereby lowering the connection resistance. After decompression, the polymer particles swell in the direction of the electrodes due to their restoring force, thereby stably maintaining the contact between the particles and the electrodes and improving the connection reliability therebetween.

The compressive deformability of the polymer particles is associated with the compactness in the molecular structure of the particles. The molecular structure of the polymer particles is related to the K value considering the compressive elastic modulus and Poisson's ratio of the polymer particles. Consequently, the K value of the polymer particles can be a criterion in determining the compressive deformability of the polymer particles. In conclusion, the polymer particles of the present invention can be defined as having a K value and a compression recovery factor in the optimum ranges, which are particularly consistent with the objects of the present invention. The K value and compression recovery factor of the polymer particles will now be explained.

In general, the relationship between applied compressive force and the amount of compressive deformation of polymer particles can be represented by the following approximation equation:

$$F = \frac{\left(\frac{\sqrt{2}}{3}\right) \cdot S^{\frac{3}{2}} \cdot E \cdot R^{\frac{1}{2}}}{1-\sigma^2} \quad (1)$$

wherein F is a load value (kg) at x % compressive deformation, S is a compression displacement (mm) at x % compressive deformation, E is a compressive elastic modulus of the particles (kgf/mm$^2$), R is a radius of the particles (mm), and σ is a Poisson's ratio of the particles.

Modification of Equation (1) gives the following equation:

$$K = \frac{E}{1-\sigma^2} \quad (2)$$

Thus, the K value of the particles can be calculated by the following equation:

$$K = \left(\frac{3}{\sqrt{2}}\right) \cdot F \cdot S^{\frac{3}{2}} \cdot R^{\frac{1}{2}} \quad (3)$$

The K value is measured using a micro-compression tester (MCT-W series, manufactured by Shimadzu Corporation Ltd., Japan). Specifically, the K value is measured by fixing a single particle between a smooth upper pressure indenter (diameter: 50 μm) and a lower pressure plate, compressing the single particle at a compression speed of 0.2275 gf/sec and a maximum test load of 5 gf to obtain a load value and a compression displacement, and substituting the obtained values into the above equation.

As described above, the polymer particles of the present invention can have a K value at 10% compressive deformation of about 250 to about 700 kgf/mm$^2$. The use of the polymer particles in the K value range defined above can enable the connection between facing electrodes in a constant gap size when interposed between the electrodes, without any damage to the electrodes. The 10% K value of the polymer particles can be in the range of about 350 to about 600 kgf/mm$^2$. When the 10% K value exceeds about 700 kgf/mm$^2$, the conductive particles interposed between the electrodes may not deform sufficiently to increase sufficiently the contact area between the electrode surface and the conductive particles, which can make it difficult to lower the connection resistance. Further, the polymer particles above the above range can be so hard that they may damage the electrode surface when the applied compressive force is increased for the purpose of lowering the connection resistance. On the other hand, when the 10% K value is lower than about 250 kgf/mm$^2$, excessive deformation can result from the applied pressure and thus the conductive layer may be peeled off from the particles, or excessive flatness can occur and thus the distance between the upper and lower electrodes is insufficiently ensured, which may result in poor adhesive force and connection reliability.

In general, the 10% K value universally and quantitatively represents the hardness of the particles. However, it is unreasonable to evaluate the compressive deformability of the particles only by the 10% K value. When electrical connection is carried out by heat-pressing, the particles undergo deformation by several tens of %. To more properly understand the electrical properties of connection structures according to the deformation of the particles, K values at both 30% and 40% compressive deformability can simultaneously be taken into consideration.

FIG. 1 is a cross-sectional view of an electrical connection structure in which the conductive particles 1 of the present invention are dispersed in an anisotropic conductive film 3 and are interposed between respective electrodes of a circuit board 2 and a glass substrate 4. As shown in FIG. 1, in order to adhere the conductive particles 1 to the electrodes and to stably maximize the contact area between the conductive particles 1 and the electrodes after deformation while uniformly and sufficiently maintaining a constant gap between the conductive particles 1 and the electrodes, the particles 1 can be hard to some extent in the initial stage of compression and can be continuously and appropriately deformed as the compression proceeds.

Generally, connection of the anisotropic conductive adhesive film containing the conductive particles to the upper and lower electrodes is carried out under a pressure of about 1 to about 5 MPa at a high temperature for a few seconds or more. At this time, the conductive particles are mainly deformed by the applied pressure. Highly deformable particles are compressively deformed by about 30 to about 40% or more. In the present invention, therefore, K values at 30% and 40% compressive deformation are used as criteria for evaluating the compressive deformability of the particles.

The 30% and 40% K values of the polymer particles 11 can range from about 20 to about 70% of the 10% K value, which is a representative value of initial hardness upon compression. When the 30% and 40% K values exceed about 70% of the 10% K value, the particles may be so hard that they are hardly deformed. Meanwhile, when the 30% and 40% K values are less than about 20% of the 10% K value, excessive deformation can take place and thus the distance between the upper and lower electrodes is insufficiently ensured such that good electrical and adhesion properties cannot be achieved. The 30% and 40% K values of the particles can, for example, be maintained at about 20 to about 60% of the 10% K value in terms of appropriate compressive deformability.

The conductive particles 1 comprising the polymer particles 11 as base particles of the conductive particles 1, which satisfy the requirement of 30% and 40% K values with respect to the 10% K value in the range specified herein, can be sufficiently deformed under a pressure commonly used to connect electrodes, e.g., about 1 to about 5 MPa. Accordingly, as shown in FIG. 1, the use of the conductive particles 1 can provide a connection structure having an increased contact area between the conductive particles 1 and the electrodes.

The compression recovery factor of the particles can be measured by obtaining the relationship between the applied loads and the compression displacements while compressing the particles to a peak load of 1.0 gf in a micro-compression tester and decompressing to an initial load of 0.1 gf. Specifically, the compression recovery factor of the particles can be defined as the ratio L2/L1 (%) wherein L1 is a displacement to the peak load upon loading and L2 is a displacement from the peak load to the initial load upon unloading. The loading and unloading can be carried out at a compression speed of 0.1517 gf/sec.

In the present invention, the compression recovery factor of the polymer particles 11 can be about 30 to about 70% in terms of stabilized adhesion, maximized contact area with the electrodes, and improved connection reliability. This appropriate recovery factor of the particles can allow swelling of the particles in the direction of the electrodes due to their recoverability returning to the original shape, thereby maintaining the contact between the particles and the electrodes and improving the connection reliability therebetween. If the recovery factor of the particles is lower than about 30%, the difference between the elasticity of the particles and an adhesive resin can be so large that a contact gap occurs, which can result in poor connection reliability. On the other hand, if the recovery factor of the particles exceeds about 70%, the recovery of the particles can be excessive, which can often result in degradation in the adhesive force of a curing binder resin and insufficient contact between the particles and the electrode. Recently, anisotropic conductive adhesive films have been fast-cured under low pressures at low temperatures for a short period of time. In this case, the use of highly elastic particles can enable fast-curing of binder resins, but can also result in insufficient contact between conductive particles and electrodes.

Further, because the particles of the present invention should not be ruptured after sufficient deformation so that the contact area with the electrodes is increased, it can be necessary to consider compressive rupture deformation. The compressive rupture deformation can be measured using the same micro-compression tester as in the measurement of compression recovery factor. Specifically, the compressive rupture deformation of the particles can be defined as the ratio Ld/D (%) wherein Ld is a displacement at a time point when the particles are ruptured and D is a diameter of the particles. Because the conductive particles 1 of the present invention should not easily rupture upon compression, the compressive rupture deformation of the polymer particles 11 can be about 40% or greater, for example, about 50% or greater.

The polymer particles 11 of the present invention can have a particle diameter of about 0.1 to about 200 μm, for example, about 1 to about 20 μm. When the particles have a particle diameter smaller than about 0.1 μm, the particles can aggregate. Meanwhile, when the particles have a particle diameter exceeding about 200 μm, the particles are rarely used as materials for recent micromounting techniques.

The polymer particles 11 can be spherical, can have an aspect ratio of less than about 1.5 and can have a coefficient of variation (CV) in particle diameter of about 20% or less to minimize degradation of connection reliability. The aspect ratio used herein refers to a ratio of the longest axis to the shortest axis in the diameter of a single particle, and the CV value refers to a percentage (%) obtained by dividing the standard deviation of the particle diameter by the average particle diameter. The polymer particles can have, for example, an aspect ratio of less than about 1.3 and a CV value not greater than about 10%.

As mentioned herein, the conductive particles of the present invention can have a structure wherein a conductive metal layer 12 is coated on the surface of the base polymer particles 11. Accordingly, the compressive deformability and compression recoverability of the conductive particles 1 can be largely dependent on the base polymer particles 11 of the conductive particles.

The polymer particles of the present invention can include a polymer resin including at least one crosslinking polymerizable monomer. In particular, the polymer particles of the present invention can include a polymer resin including a monomer and at least one crosslinking polymerizable monomer selected from the group consisting of allyl compounds, e.g., 1,4-butanediol di(meth)acrylate, 1,6-hexanediol di(meth)acrylate, 1,9-nonanediol di(meth)acrylate, allyl (meth)acrylate, divinylsulfone, diallyl phthalate, diallylacrylamide, triallyl (iso)cyanurate and triallyl trimellitate; (poly)alkylene glycol di(meth)acrylates, e.g., (poly)ethylene glycol di(meth)acrylate and (poly)propylene glycol di(meth)acrylate; (poly)dimethylsiloxane di(meth)acrylate, (poly)dimethylsiloxane divinyl, (poly)urethane di(meth)acrylate, pentaerythritol tri(meth)acrylate, pentaerythritol di(meth)acrylate, trimethylolpropane tri(meth)acrylate, di(trimethylolpropane) tetra(meth)acrylate, tetramethylolpropane tetra(meth)acrylate, dipentaerythritol hexa(meth)acrylate, dipentaerythritol penta(meth)acrylate, and glycerol tri(meth)acrylate, and the like and mixtures thereof.

Exemplary monomers useful in combination with the crosslinking polymerizable monomers can include, without limitation, polymerizable unsaturated monomers that can be copolymerized with the crosslinking polymerizable monomers. Specific examples of polymerizable unsaturated monomers can include styrene-based monomers, e.g., styrene, α-methyl styrene, m-chloromethyl styrene and ethyl vinyl benzene, methyl (meth)acrylate, ethyl (meth)acrylate, propyl (meth)acrylate, n-butyl(meth)acrylate, isobutyl(meth)acrylate, t-butyl(meth)acrylate, 2-ethylhexyl(meth)acrylate, n-octyl(meth)acrylate, lauryl(meth)acrylate, stearyl(meth)acrylate, ethyleneglycol (meth)acrylate, glycidyl (meth)acrylate, chlorovinyl, acrylic acid esters, acrylonitrile, vinyl acetate, vinyl propionate, vinyl butyrate, vinyl ether, allyl butyl ether, butadiene, and isoprene, and the like. These polymerizable unsaturated monomers may be used alone or in combination.

The polymer particles of the present invention can be prepared, without limitation, by suspension polymerization, dispersion polymerization, seeded polymerization, and soap-free emulsion polymerization. In the present invention, seeded polymerization was used to prepare polymer particles having a uniform particle diameter distribution.

The seeded polymerization can be carried out as follows. First, polymer seed particles having a uniform particle diameter can be dispersed in an aqueous solution. An aqueous emulsion of a (crosslinking) polymerizable unsaturated monomer in which an oil-soluble initiator is dissolved can be added to the dispersion. This addition swells the monomer inside the seed particles. Thereafter, the (crosslinking) polymerizable unsaturated monomer containing the seed particles can be polymerized to prepare polymer particles. Because the molecular weight of the polymer seed particles can greatly affect the phase separation and mechanical properties of the polymer particles prepared by the seeded polymerization, the molecular weight of the polymer seed particles can range from about 1,000 to about 30,000, for example, about 5,000 to about 20,000. In addition, the content of the (crosslinking) polymerizable unsaturated monomer can be about 10 to about 300 parts by weight, based on one part by weight of the swollen polymer seed particles.

The initiator used to prepare the polymer particles can be a common oil-soluble radical initiator. Examples thereof can include without limitation peroxide-based compounds, e.g., benzoyl peroxide, lauryl peroxide, o-chlorobenzoyl peroxide, o-methoxybenzoyl peroxide, t-butylperoxy-2-ethylhexanoate, t-butyl peroxyisobutyrate, 1,1,3,3-tetramethylbutylperoxy-2-ethylhexanoate, dioctanoyl peroxide and didecanoyl peroxide, and azo compounds, e.g., 2,2'-azobisisobutyronitrile, 2,2'-azobis(2-methylbutyronitrile) and 2,2'-azobis(2,4-dimethylvaleronitrile), and the like, and mixtures thereof. The initiator can be used in an amount of about 0.1 to about 20% by weight, based on the total weight of the monomers.

During polymerization of the polymer particles, if necessary, a surfactant and a dispersion stabilizer can be used to stabilize the latex. Examples of suitable surfactants include without limitation common surfactants, such as anionic, cationic, and non-ionic surfactants, and mixtures thereof.

The dispersion stabilizer can be a material that can be dissolved or dispersed in polymerization media. Examples thereof can include without limitation water-soluble polymers, e.g., gelatin, starch, methylcellulose, ethylcellulose, hydroxyethylcellulose, carboxymethylcellulose, polyvinylpyrrolidone, polyvinyl alkyl ether, polyvinyl alcohol, polyacrylic acid, polyacrylamide, polyethylene oxide and sodium polymethacrylate, barium sulfate, calcium sulfate, calcium carbonate, calcium phosphate, aluminum sulfate, talc, clay, diatomaceous earth, and metal oxide powders, and the like. These materials may be used alone or in combination. The dispersion stabilizer can be used in an amount sufficient to inhibit the settlement of the polymer particles formed during polymerization due to gravity and aggregation of the particles. The dispersion stabilizer can be used, for example, in an amount of about 0.01 to about 15 parts by weight, based on 100 parts by weight of all the reactants.

The conductive particles 1 can be prepared by forming the metal layer 12 on the surface of the polymer particles 11. Examples of metals that can be used to form the metal layer 12 can include, but are not limited to, nickel (Ni), gold (Au), silver (Ag), copper (Cu), platinum (Pt), palladium (Pd), cobalt (Co), tin (Sn), indium (In), indium tin oxide (ITO), and the like, and multilayer composite metals containing one or more of these metals as main components. Exemplary conductive particles of the invention can include a double metal layer of nickel/gold in which the surface of the polymer particles 11 is sequentially plated with nickel and gold. Another conductive metal, such as platinum (Pt) or silver (Ag), can be used instead of gold.

Examples of methods for forming the metal layer on the base particles can include, but are not limited to, electroless plating, coating using metal powders, vacuum deposition, ion plating, and ion sputtering, and the like.

Conductive particles can be prepared using electroless plating via the following three steps: first step (pretreatment of the surface of the base particles)—defatting, etching, sensitizing, catalyzing, treating with a reducing agent, and the like; second step—electroless nickel (Ni) plating and washing; and third step—gold (Au) substitution plating.

Electroless plating can include the following specific procedure. First, the polymer particles can be dipped in a surfactant solution having a proper concentration to wash and defat the particle surface. Thereafter, etching can be performed using a mixed solution of chromic acid and sulfuric acid to form anchors on the surface of the base particles. The surface-treated base particles can be dipped in a solution of tin chloride and palladium chloride to catalyze and activate the particle surface. As a result, fine nuclei of the palladium catalyst can form on the surface of the base particles. Subsequently, a reduction reaction can be carried out using sodium hypophosphite, sodium borohydride, dimethyl amine borane, hydrazine, and the like, to form uniform palladium nuclei on the particles. The resulting base particles can be dispersed in an electroless nickel plating solution, after which the nickel salts can be reduced using sodium hypophosphite to form a nickel-plated layer on the base particles. The nickel-plated base particles can be added to an electroless gold plating solution having a certain concentration to induce a gold substitution plating reaction, thereby forming a gold-deposited layer on the outermost layer.

The conductive metal layer 12 in the conductive particles 1 of the present invention can have a thickness of about 0.01 to about 5 μm. When the thickness of the metal layer is less than about 0.01 μm, it can be difficult to attain the desired conductivity. On the other hand, when the thickness of the metal layer exceeds about 5 μm, the deformability, elasticity and recoverability of the particles may not be satisfactory due to the thick metal layer, and the particles tend to aggregate when used in electrode packaging materials, making it difficult to show enhanced conducting properties.

The present invention can also provide an anisotropic conductive packaging material comprising the conductive particles. The present invention can also provide an electrical connection structure in which the anisotropic conductive packaging material is interposed and is heat-pressed between a pair of facing substrates.

The present invention will now be described in more detail with reference to the following examples. However, these examples are given for the purpose of illustration and are not to be construed as limiting the scope of the invention.

Example 1

(1) Preparation of Seed Particles 25 parts by weight of a styrene monomer, 5 parts by weight of 2,2'-azobis(2,4-dimethylvaleronitrile) as an initiator, 18.7 parts by weight of polyvinylpyrrolidone (molecular weight: 40,000), and 200 parts by weight of methanol and 15 parts by weight of ultrapure water as reaction media are mixed together, quantified, and added to a reactor. Thereafter, the reaction mixture is subjected to polymerization under a nitrogen atmosphere at 60° C. for 24 hours to prepare polystyrene seed particles. The seed particles are completely washed with ultrapure water and methanol, and dried in a vacuum freeze dryer to obtain a powder. The seed particles are measured to have an average particle diameter of 1.13 μm, a CV value of 4.0%, and a molecular weight of 12,500.

(2) Preparation of Polymer Resin-based Particles 2 parts by weight of the seed particles are homogeneously dispersed in 450 parts by weight of an aqueous sodium lauryl sulfate (SLS) solution (0.2 wt %). Separately, a monomer mixture including 60 parts by weight of styrene, 10 parts by weight of divinylbenzene and 30 parts by weight of 1,6-hexanediol diacrylate, wherein 1.5 parts by weight of benzoyl peroxide as an initiator are dissolved, is added to 300 parts by weight of an aqueous SLS solution (0.2 wt %). The resulting mixture is emulsified for 10 minutes using a homogenizer. The monomer emulsion is added to the seed dispersion to swell the monomers inside the seed particles at room temperature. After completion of the swelling, 500 parts by weight of an aqueous polyvinylalcohol solution (5 wt %) having a saponification degree of about 88% is added thereto. After the temperature of the reactor is raised to 80° C., polymerization is performed. The crosslinking polymerized resin particles thus prepared are washed with ultrapure water and ethanol several times, and dried in vacuo at room temperature. The K value, compression recovery factor and compressive rupture deformation of the polymer particles are measured using a micro-compression tester. The obtained results are shown in Table 1.

(3) Preparation and Evaluation of Conductive Particles

The polymer particles are etched using chromic acid and sulfuric acid, dipped in a palladium chloride solution, and reduced to form fine nuclei of the palladium on the surface of the base particles. Thereafter, electroless nickel plating and gold substitution plating are sequentially performed to obtain conductive particles in which a nickel/gold conductive metal layer is formed on the base particles.

(4) Manufacture and Evaluation of Anisotropic Conductive Connection Structure 15 parts by weight of a bisphenol A epoxy resin having an epoxy equivalent of 6,000 and 7 parts by weight 2-methylimidazole as a curing agent are dissolved in a mixed solvent of toluene and methyl ethyl ketone, after which 10% by weight of the conductive particles and a silane-based coupling agent are dispersed in the solution. The resulting dispersion is coated on a PET release film, and dried to produce a 25 μm-thick anisotropic conductive adhesive film.

An anisotropic conductive film is produced from the anisotropic conductive adhesive film (ACF) so as to have the following dimensions. Height of bump electrodes: 40 μm, IC chip size: 6 mm×6 mm, thickness of BT resin substrate: 0.7 mm, thickness of wiring patterns formed on the substrate by copper and gold plating: 8 μm, pitch: 100 μm. The anisotropic conductive film is interposed between the IC chip and the substrate, and then pressurized to 3.5 MPa while heating at 180° C. for 10 seconds to manufacture an electrical connection structure.

To measure the electrical resistance between upper and lower electrodes of the connection sample, electrical resistance values between 20 adjacent upper and lower electrodes are measured, and averaged. Results are shown as connection resistance values in Table 1. Further, after the connection sample is aged at 85° C. and 85% RH for 1,000 hours, connection reliability is evaluated according to the increment in resistance as follows:

⊚: ≦0.1 Ω, Δ: 0.1 Ω~0.3 Ω, x: >0.3Ω

Example 2

Polymer particles and conductive particles are prepared in the same manner as in Example 1, except that a monomer mixture including 60 parts by weight of styrene, 20 parts by weight of divinylbenzene and 20 parts by weight of 1,6-hexanediol diacrylate is used instead of the monomer mixture including 60 parts by weight of styrene, 10 parts by weight of divinylbenzene and 30 parts by weight of 1,6-hexanediol diacrylate. A connection structure is manufactured using the conductive particles. The properties of the polymer particles, the conductive particles and the connection structure are evaluated in the same manner as in Example 1. The results are shown in Table 1.

Example 3

Polymer particles and conductive particles are prepared in the same manner as in Example 1, except that a monomer mixture including 60 parts by weight of styrene, 10 parts by weight of divinylbenzene and 30 parts by weight of polydimethylsiloxane diacrylate (synthesized in the present invention, molecular weight: 950) is used instead of the monomer mixture including 60 parts by weight of styrene, 10 parts by weight of divinylbenzene and 30 parts by weight of 1,6-hexanediol diacrylate. A connection structure is manufactured using the conductive particles. The properties of the polymer particles, the conductive particles and the connection structure are evaluated in the same manner as in Example 1. The results are shown in Table 1.

Comparative Example 1

Polymer particles and conductive particles are prepared in the same manner as in Example 1, except that 100 parts by weight of divinylbenzene is used instead of the monomer mixture including 60 parts by weight of styrene, 10 parts by weight of divinylbenzene and 30 parts by weight of 1,6-hexanediol diacrylate. A connection structure is manufactured using the conductive particles. The properties of the polymer particles, the conductive particles and the connection structure are evaluated in the same manner as in Example 1. The results are shown in Table 1.

Comparative Example 2

Polymer particles and conductive particles are prepared in the same manner as in Example 1, except that a monomer mixture including 90 parts by weight of styrene and 10 parts by weight of divinylbenzene is used instead of the monomer mixture including 60 parts by weight of styrene, 10 parts by weight of divinylbenzene and 30 parts by weight of 1,6-hexanediol diacrylate. A connection structure is manufactured using the conductive particles. The properties of the polymer particles, the conductive particles and the connection structure are evaluated in the same manner as in Example 1. The results are shown in Table 1.

TABLE 1

|  |  | Examples | | | Comparative Examples | |
|---|---|---|---|---|---|---|
| | Properties | 1 | 2 | 3 | 1 | 2 |
| Polymer particles | Average particle diameter (μm) | 4.5 | 4.4 | 4.6 | 4.5 | 4.7 |
| | CV value (%) | 3.8 | 3.8 | 4.1 | 3.9 | 4.0 |
| | 10% K value (kgf/mm$^2$) | 488 | 516 | 440 | 650 | 310 |
| | K30/K10 (%) | 47 | 52 | 33 | 73 | 31 |
| | K40/K10 (%) | 56 | 61 | 48 | 81 | 45 |
| | Compression recovery factor (%) | 44 | 50 | 40 | 52 | 11 |
| | Compressive rupture deformation (%) | 55 | 53 | 62 | 51 | 60 |

TABLE 1-continued

|  |  | Examples | | | Comparative Examples | |
|---|---|---|---|---|---|---|
| Properties | | 1 | 2 | 3 | 1 | 2 |
| ACF containing conductive particles | Connection resistance (Ω) | 0.6 | 0.6 | 0.7 | 1.3 | 1.2 |
| | Connection reliability | ⊚ | ⊚ | Δ | X | X |

* In Table 1, K10, K30 and K40 represent 10% K value, 30% K value and 40% K value, respectively.

As can be seen from the results shown in Table 1, because the conductive particles (Examples 1 to 3) having appropriate K values and compression recovery factor had good deformability and recoverability, the anisotropic conductive adhesive films produced in Examples 1 to 3 exhibit much superior connection resistance and connection reliability as compared to those (Comparative Examples 1 and 2) containing the conductive particles with poor deformability and recoverability.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

That which is claimed is:

1. A polymer particle comprises a polymer resin comprising at least one crosslinking polymerizable monomer; a styrene-based monomer; and divinylbenzene, wherein said crosslinking polymerizable monomer comprises a monomer selected from the group consisting of allyl compounds, (poly)alkylene glycol di(meth)acrylates, (poly)dimethylsiloxane di(meth)acrylate, (poly)dimethylsiloxane divinyl, (poly)urethane di(meth)acrylate, pentaerythritol (meth)acrylates, methylolpropane (meth)acrylates, glycerol tri(meth)acrylate, and mixtures thereof and the polymer particle having a 10% K value (K value at 10% particle diameter compressive deformation) of about 250 to about 700 kgf/mm$^2$ and a compression recovery factor of about 30 to about 70%, wherein the polymer particle further has a 30% K value (K value at 30% compressive deformation) and a 40% K value (K value at 40% compressive deformation) of about 20 to about 70% of the 10% K value.

2. The polymer particle according to claim 1, wherein the polymer particle has a 10% K value of about 350 to about 600 kgf/mm$^2$.

3. The polymer particle according to claim 1, wherein the polymer particle has a compression rupture deformation of about 40% or higher.

4. The polymer particle according to claim 1, wherein the polymer particle has an average particle diameter of about 0.1 to about 200 μm.

5. The polymer particle according to claim 1, wherein the polymer particle has an aspect ratio lower than about 1.5 and a coefficient of variation (CV) value not higher than about 20%.

6. The polymer particle according to claim 1, wherein said allyl compound comprises at least one compound selected from the group consisting of 1,4-butanediol di(meth)acrylate, 1,6-hexanediol di(meth)acrylate, 1,9-nonanediol di(meth)acrylate, allyl (meth)acrylate, divinylsulfone, diallyl phthalate, diallylacrylamide, triallyl (iso)cyanurate, triallyl trimellitate, and mixtures thereof.

7. The polymer particle according to claim 1, wherein said (poly)alkylene glycol di(meth)acrylate comprises at least one compound selected from the group consisting of (poly)ethylene glycol di(meth)acrylate, (poly)propylene glycol di(meth)acrylate, and mixtures thereof.

8. The polymer particle according to claim 1, wherein said pentaerythritol (meth)acrylate comprises a compound selected from the group consisting of pentaerythritol tri(meth)acrylate, pentaerythritol di(meth)acrylate, dipentaerythritol hexa(meth)acrylate, dipentaerythritol penta(meth)acrylate, and mixtures thereof.

9. The polymer particle according to claim 1, wherein said methylolpropane (meth)acrylate comprises a compound selected from the group consisting of trimethylolpropane tri(meth)acrylate, di(trimethylolpropane) tetra(meth)acrylate, tetramethylolpropane tetra(meth)acrylate, and mixtures thereof.

10. A conductive particle comprising:
a polymer particle comprises a polymer resin comprising at least one crosslinking polymerizable monomer; a styrene-based monomer; and divinylbenzene, wherein said crosslinking polymerizable monomer comprises a monomer selected from the group consisting of allyl compounds, (poly)alkylene glycol di(meth)acrylates, (poly)dimethylsiloxane di(meth)acrylate, (poly)dimethylsiloxane divinyl, (poly)urethane di(meth)acrylate, pentaerythritol (meth)acrylates, methylolpropane (meth)acrylates, glycerol tri(meth)acrylate, and mixtures thereof and the polymer particle having a 10% K value (K value at 10% particle diameter compressive deformation) of about 250 to about 700 kgf/mm$^2$ and a compression recovery factor of about 30 to about 70%, wherein the polymer particle further has a 30% K value (K value at 30% compressive deformation) and a 40% K value (K value at 40% compressive deformation) of about 20 to about 70% of the 10% K value, and
at least one conductive metal layer formed on the surface of the polymer particle.

11. The conductive particle according to claim 10, wherein the conductive metal layer comprises at least one metal selected from the group consisting of nickel (Ni), gold (Au), silver (Ag), copper (Cu), platinum (Pt), palladium (Pd), cobalt (Co), tin (Sn), indium (In), indium tin oxide (ITO), and mixtures thereof.

12. The conductive particle according to claim 10, wherein the conductive metal layer comprises a double layer of nickel and gold.

13. The conductive particle according to claim 10, wherein the conductive metal layer has a thickness of about 0.01 to about 5 μm.

14. An anisotropic conductive packaging material comprising:
a polymer particle comprises a polymer resin comprising at least one crosslinking polymerizable monomer; a styrene-based monomer; and divinylbenzene, wherein said crosslinking polymerizable monomer comprises a monomer selected from the group consisting of allyl compounds, (poly)alkylene glycol di(meth)acrylates, (poly)dimethylsiloxane di(meth)acrylate, (poly)dimethylsiloxane divinyl, (poly)urethane di(meth)acrylate, pentaerythritol (meth)acrylates, methylolpropane (meth)acrylates, glycerol tri(meth)acrylate, and mixtures thereof and the polymer particle having a 10% K value (K value at 10% particle diameter compressive deformation) of about 250 to about 700 kgf/mm² and a compression recovery factor of about 30 to about 70%, wherein the polymer particle further has a 30% K value (K value at 30% compressive deformation) and a 40% K value (K value at 40% compressive deformation) of about 20 to about 70% of the 10% K value, and at least one conductive metal layer formed on the surface of the polymer particle.

15. An electrical connection structure comprising:
a pair of facing substrates; and
an anisotropic conductive packaging material interposed between the facing substrates and comprising a polymer particle comprises a polymer resin comprising at least one crosslinking polymerizable monomer; a styrene-based monomer; and divinylbenzene, wherein said crosslinking polymerizable monomer comprises a monomer selected from the group consisting of allyl compounds, (poly)alkylene glycol di(meth)acrylates, (poly)dimethylsiloxane di(meth)acrylate, (poly)dimethylsiloxane divinyl, (poly)urethane di(meth)acrylate, pentaerythritol (meth)acrylates, methylolpropane (meth)acrylates, glycerol tri(meth)acrylate, and mixtures thereof and the polymer particle having a 10% K value (K value at 10% particle diameter compressive deformation) of about 250 to about 700 kgf/mm² and a compression recovery factor of about 30 to about 70%, wherein the polymer particle further has a 30% K value (K value at 30% compressive deformation) and a 40% K value (K value at 40% compressive deformation) of about 20 to about 70% of the 10% K value, and at least one conductive metal layer formed on the surface of the polymer particle.

16. The electrical connection structure according to claim 15, wherein said anisotropic conductive packaging material is subjected to pressure while heating.

17. The conductive particle according to claim 10, wherein the polymer particle comprises a polymer resin comprising crosslinking polymerizable monomer and divinyl benzene in an amount greater than zero weight percent and no greater than 40 weight percent; and a styrene-based monomer.

18. The polymer particle according to claim 1, wherein the polymer particle comprises a polymer resin comprising crosslinking polymerizable monomer and divinyl benzene in an amount greater than zero weight percent and no greater than 40 weight percent; and a styrene-based monomer.

* * * * *